US012119405B2

(12) United States Patent
Aoki et al.

(10) Patent No.: US 12,119,405 B2
(45) Date of Patent: Oct. 15, 2024

(54) DISPLAY DEVICE HAVING A FIRST TRANSISTOR INCLUDING A CRYSTALLINE SILICON SEMICONDUCTOR LAYER AND A SECOND TRANSISTOR INCLUDING AN OXIDE SEMICONDUCTOR LAYER

(71) Applicant: SHARP KABUSHIKI KAISHA, Sakai (JP)

(72) Inventors: Tomohisa Aoki, Sakai (JP); Hiroaki Furukawa, Sakai (JP); Yuhichi Saitoh, Sakai (JP); Atsushi Hachiya, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 448 days.

(21) Appl. No.: 17/603,308

(22) PCT Filed: Apr. 26, 2019

(86) PCT No.: PCT/JP2019/018021
§ 371 (c)(1),
(2) Date: Oct. 12, 2021

(87) PCT Pub. No.: WO2020/217477
PCT Pub. Date: Oct. 29, 2020

(65) Prior Publication Data
US 2022/0209020 A1    Jun. 30, 2022

(51) Int. Cl.
H10K 59/12      (2023.01)
H01L 29/786     (2006.01)
H10K 59/121     (2023.01)
H10K 59/131     (2023.01)

(52) U.S. Cl.
CPC .... H01L 29/78672 (2013.01); H01L 29/7869 (2013.01); H10K 59/1213 (2023.02); H10K 59/1216 (2023.02); H10K 59/131 (2023.02)

(58) Field of Classification Search
CPC .......... H01L 29/76872; H01L 29/7669; H10K 59/131; H10K 59/1213; H10K 59/1216
USPC ...................................................... 257/288
See application file for complete search history.

(56) References Cited

U.S. PATENT DOCUMENTS

| 2012/0287025 A1 | 11/2012 | Inoue et al. |
| 2013/0069055 A1 | 3/2013 | Yamazaki et al. |
| 2015/0187814 A1 | 7/2015 | Miyairi et al. |
| 2015/0243220 A1 | 8/2015 | Kim et al. |
| 2015/0255490 A1 | 9/2015 | Miyairi |
| 2016/0351122 A1 | 12/2016 | Jung et al. |
| 2016/0380007 A1 | 12/2016 | Miyairi |

(Continued)

FOREIGN PATENT DOCUMENTS

| JP | 2012-252329 A | 12/2012 |
| JP | 2013-084925 A | 5/2013 |
| JP | 2015-144271 A | 8/2015 |

(Continued)

Primary Examiner — Phuc T Dang
(74) Attorney, Agent, or Firm — ScienBiziP, P.C.

(57) ABSTRACT

An oxide semiconductor layer includes a second channel region and a second conductor region. The lower metal layer includes a contact wire in contact with the second conductor region. The upper metal layer includes an upper wire. A second interlayer insulating film is provided with a second contact hole overlapping an upper wire and the contact wire. The second conductor region and the upper wire electrically connect together through the contact wire.

20 Claims, 9 Drawing Sheets

(56) References Cited

U.S. PATENT DOCUMENTS

2018/0197474 A1    7/2018    Jeon et al.

FOREIGN PATENT DOCUMENTS

| JP | 2015-188070 A | 10/2015 | | |
|---|---|---|---|---|
| JP | 2018-195747 A | 12/2018 | | |
| WO | WO-2018074324 A1 * | 4/2018 | ........... | G02F 1/1333 |
| WO | WO-2020213102 A1 * | 10/2020 | ......... | H01L 27/1225 |

* cited by examiner

DISPLAY DEVICE HAVING A FIRST TRANSISTOR INCLUDING A CRYSTALLINE SILICON SEMICONDUCTOR LAYER AND A SECOND TRANSISTOR INCLUDING AN OXIDE SEMICONDUCTOR LAYER

TECHNICAL FIELD

The disclosure relates to a display device.

BACKGROUND ART

Patent Document 1 discloses a semiconductor circuit including: a transistor containing a silicon semiconductor layer; and another transistor containing an oxide semiconductor layer. The transistors are formed on a single substrate.

CITATION LIST

Patent Literature

[Patent Document 1] Japanese Unexamined Patent Application Publication No. 2018-195747

SUMMARY

Technical Problem

A problem of the semiconductor circuit disclosed in Patent Document 1 is that, when a conductor region and a metal layer in the oxide semiconductor layer are electrically connected together through a contact hole, the contact resistance between the conductor region and the metal layer is likely to increase.

Solution to Problem

A display device according to an aspect of the disclosure includes: a crystalline silicon semiconductor layer, a first gate insulating film, a first gate electrode, a first interlayer insulating film, a lower metal layer, an oxide semiconductor layer, a second gate insulating film, a second gate electrode, a second interlayer insulating film, and an upper metal layer, all of which are provided above a substrate in a stated order; and a first transistor including the crystalline silicon semiconductor layer, and a second transistor including the oxide semiconductor layer. The crystalline silicon semiconductor layer includes a first channel region and a first conductor region. The oxide semiconductor layer includes a second channel region and a second conductor region. The first gate insulating film and the first interlayer insulating film are provided with a first contact hole exposing the first conductor region and electrically connecting together the first conductor region and the second conductor region. The lower metal layer includes a contact wire in contact with the second conductor region. The upper metal layer includes an upper wire. The second interlayer insulating film is provided with a second contact hole overlapping the upper wire and the contact wire. The second conductor region and the upper wire electrically connect together through the contact wire.

Advantageous Effects of Disclosure

An aspect of the disclosure can reduce contact resistance between a second conductor region of an oxide semiconductor layer and an upper wire.

DESCRIPTION OF EMBODIMENTS

FIG. 1(a) is a schematic plan view illustrating a configuration of a display device in embodiments. FIG. 1(b) is a cross-sectional view illustrating the configuration of the display device.

Figure 1:
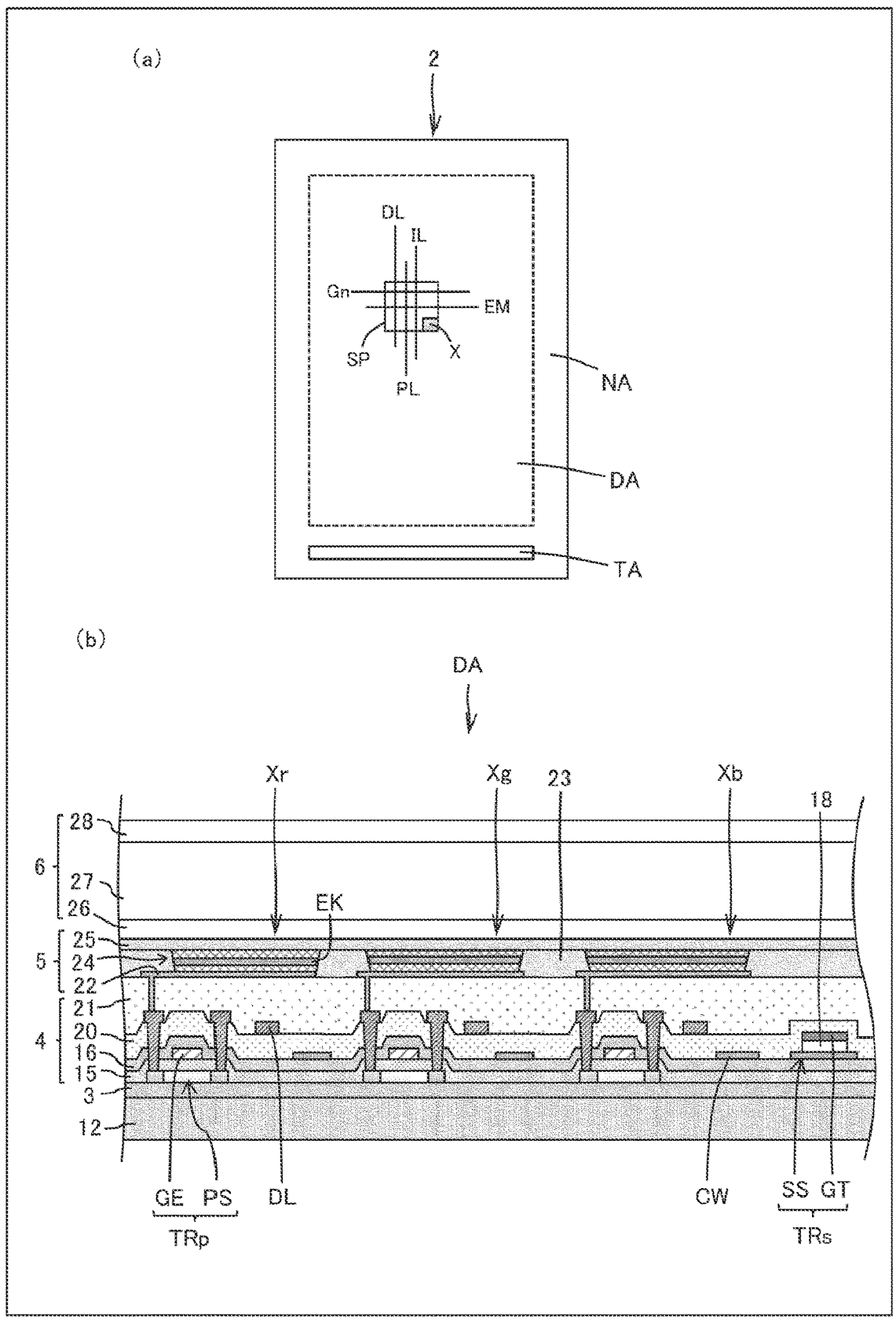
FIG. 1(a) is a schematic plan view illustrating a configuration of a display device according to embodiments.
FIG. 1(b) is a cross-sectional view illustrating the configuration of the display device.

As illustrated in FIG. 1, a display device 2 includes: a base coat film 3; a thin-film transistor (TFT) layer 4; a light-emission element layer 5 of a top-emission type (i.e. emitting light upwards); and a sealing layer 6, all of which are formed on a substrate 12 in the stated order. The display device 2 includes a display region DA in which a plurality of sub-pixels SP are formed. Each of the sub-pixels SP includes a light-emission element X. The display region DA is surrounded with a frame region NA provided with a terminal unit TA.

The substrate 12 is a glass substrate or a flexible base material mainly made of such a resin as polyimide. The substrate 12 can be formed of, for example, two polyimide films and an inorganic film sandwiched therebetween. The base coat film (an undercoat layer) 3 is an inorganic insulating layer blocking intrusion of such foreign objects as water and oxygen. The base coat film 3 can be formed of, for example, silicon nitride and silicon oxide.

As illustrated in FIG. 1(b), the thin-film transistor layer 4 includes: a crystalline silicon semiconductor layer PS above the base coat film 3; a first gate insulating film 15 above the crystalline silicon semiconductor layer PS; a first metal layer M1 (including a gate electrode GE) above the first gate insulating film 15; a first interlayer insulating film 16 above the first metal layer; a second metal layer M2 (i.e. a lower metal layer including a contact wire CW) above the first interlayer insulating film 16; an oxide semiconductor layer SS above the second metal layer; a second gate insulating film 18 above the oxide semiconductor layer SS; a third metal layer M3 (including a gate electrode GT) above the second gate insulating film 18; a second interlayer insulating film 20 above the third metal layer; a fourth metal layer M4 (i.e. an upper metal layer including a data signal line DL) above the second interlayer insulating film 20; and a planarization film 21 above the fourth metal layer M4.

The semiconductor layer PS is made of, for example, low-temperature polysilicon (LTPS). The oxide semiconductor layer is made of oxygen and at least one of elements selected from among, for example, indium (In), gallium (Ga), tin (Sn), hafnium (Hf), zirconium (Zr), and zinc (Zn). Specifically, the oxide semiconductor layer can be made of such materials as: an oxide semiconductor (InGaZnO) containing indium (In), gallium (Ga), zinc (Zn), and oxygen; an oxide semiconductor (InSnZnO) containing indium (In), tin (Sn), zinc (Zn), and oxygen; an oxide semiconductor (InZrZnO) containing indium (In), zirconium (Zr), zinc (Zn), and oxygen; and an oxide semiconductor (InHfZnO) containing indium (In), hafnium (Hf), zinc (Zn), and oxygen.

In FIG. 1(b), a first transistor TRp includes the gate electrode GE and the crystalline silicon semiconductor layer PS, and a second transistor TRs includes the gate electrode GT and the oxide semiconductor layer SS.

Each of the first metal layer M1, the third metal layer M3, and the fourth metal layer M4 is a monolayer film made of at least one of such metals as, for example, aluminum, tungsten, molybdenum, tantalum, chromium, titanium, and copper, or a multilayer film formed of these metals. The second metal layer M2 is a metal film made of, for example, tungsten, molybdenum, or titanium.

Each of the first interlayer insulating film 16, the first gate insulating film 15, the second gate insulating film 18, and the second interlayer insulating film 20 can be a silicon oxide (SiOx) film, or a silicon nitride (SiNx) film formed by, for example, chemical vapor deposition (CVD), or can be a multilayer film including these films. The planarization film 21 can be formed of, for example, such an applicable organic material as polyimide and acrylic resin.

The light-emission element layer 5 includes: a first electrode (a lower electrode) 22 above the planarization film 21; an edge cover film 23, of insulation, covering an edge of the first electrode 22; an electroluminescence (EL) layer 24 above the edge cover film 23; and a second electrode (an upper electrode) 25 above the EL layer 24. The edge cover film 23 is made of, for example, such an organic material as polyimide and acrylic resin. The organic material is applied and then patterned by photolithography to form the edge cover film 23.

As illustrated in FIG. 1, the light-emission element layer 5 includes, for example, a light-emission element Xr (red), a light-emission element Xg (green), and a light-emission element Xb (blue). Each of the light-emission elements includes: the first electrode 22 and the EL layer 24 (including a light-emission layer EK) each shaped into an island; and the second electrode 25. The second electrode 25 is a common electrode shaped into a monolithic form in common among the light-emission elements.

Each of the light-emission elements Xr, Xg, and Xb may be, for example, an organic light-emission diode (OLED) including an organic layer as a light-emission layer, or a quantum-dot light-emission diode (QLED) including a quantum-dot layer as a light-emission layer.

The EL layer 24 includes a hole-injection layer, a hole-transport layer, the light-emission layer EK, an electron-transport layer, and an electron-injection layer stacked on top of another in the stated order from below. Utilizing, for example, vapor deposition, ink-jet printing, or photolithography, the light-emission layer is formed to have a shape of an island at an opening (for each of the sub-pixels) of the edge cover film 23. The other layers are shaped into islands or a monolithic form (a common layer). The EL layer 24 may omit one or more of the hole-injection layer, the hole-transport layer, the electron-transport layer, and the electron-injection layer.

The first electrode 22 (an anode), which reflects light, is formed of, for example, a stack of indium tin oxide (ITO) and either silver (Ag) or an alloy containing Ag. The second electrode 25 (a cathode), which is transparent to light, is formed of, for example, a thin film made of such metal as an alloy of magnesium and silver.

If the light-emission elements Xr, Xg, and Xb are each an OLED, holes and electrons recombine together in the light-emission layer EK by a drive current between the first electrode 22 and the second electrode 25, which forms an exciton. While the exciton transforms to the ground state, light is released. If the light-emission elements Xr, Xg, and Xb are each a QLED, holes and electrons recombine together in the light-emission layer EK by a drive current between the first electrode 22 and the second electrode 25, which forms an exciton. While the exciton transforms from the conduction band level to the valence band level, light is released.

In FIG. 1(b), the sealing layer 6 covering the light-emission element layer 5 prevents such foreign objects as water and oxygen from penetrating into the light-emission element layer 5. The sealing layer 6 can include, for example: two layers of inorganic sealing films 26 and 28; and an organic film 27 formed therebetween.

Figure 2:
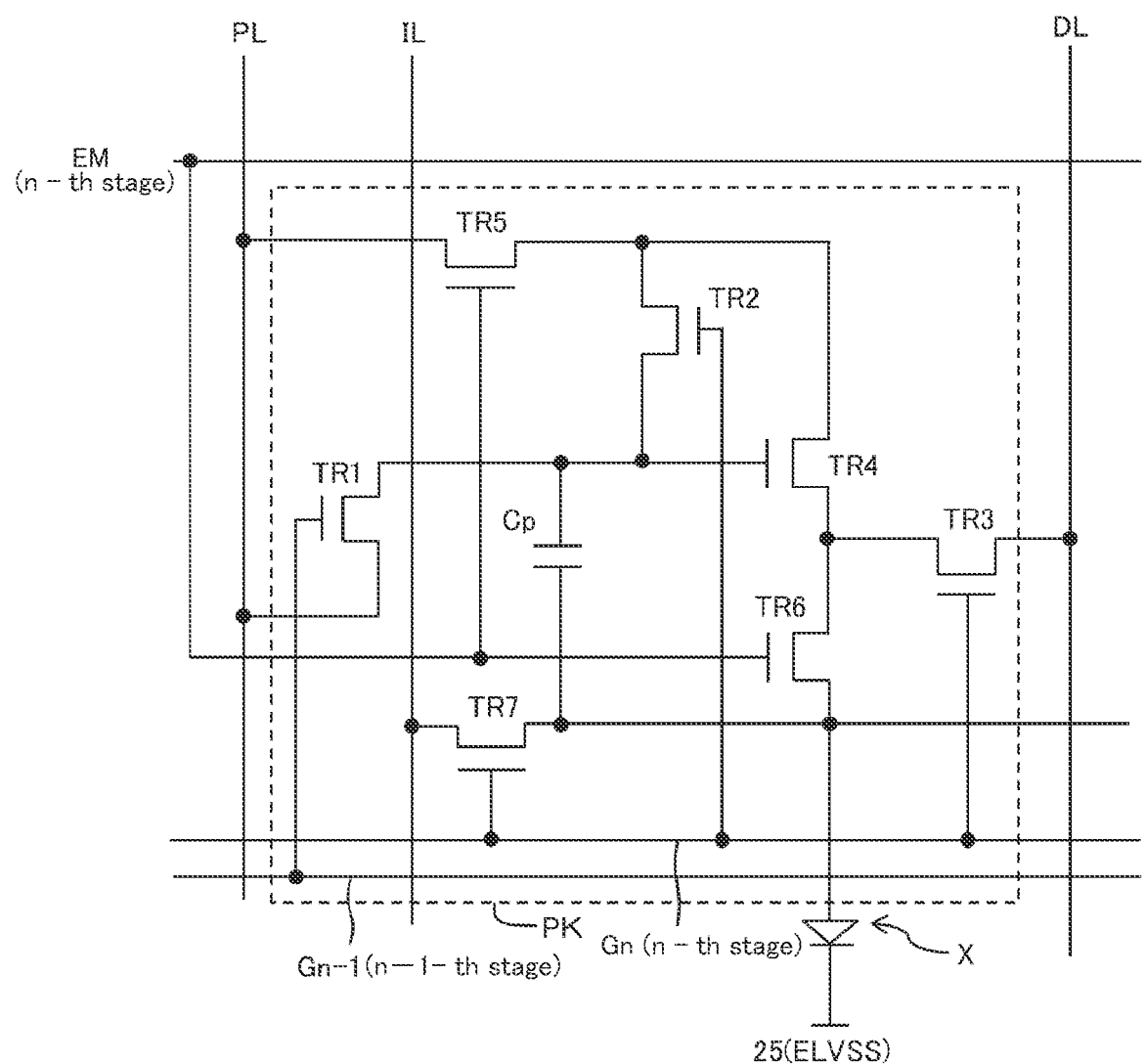
FIG. 2 is a circuit diagram illustrating an example of a pixel circuit.

FIG. 2 is a circuit diagram illustrating an example of a pixel circuit. In the display region DA of FIG. 1, a light-emission element X and a pixel circuit PK of the light-emission element X are provided for each of sub-pixels SP. This pixel circuit PK and a wire connected to the pixel circuit PK are formed in the thin-film transistor layer 4.

The pixel circuit PK in FIG. 2 includes: a capacitor Cp; a first initialization transistor TR1 having a gate terminal connected to a scan signal line Gn−1 in a preceding stage (n−1-th stage); a threshold control transistor TR2 having a gate terminal connected to a scan signal line Gn in a current stage (n-th stage); a write control transistor TR3 having a gate terminal connected to the scan signal line Gn in a current stage (n-th stage); a drive transistor TR4 controlling a current of the light-emission element X; a power source supply transistor TR5 having a gate terminal connected to a light-emission control line EM (n-th stage); a light-emission control transistor TR6 having a gate terminal connected to the light-emission control line EM (n-th stage); and a second initialization transistor TR7 having a gate terminal connected to the scan signal line Gn in a current stage (n-th stage).

The drive transistor TR4 has a gate terminal connected to an anode of the light-emission element X through the capacitor Cp, and to a high-voltage power source line (also serving as a first initialization power source line) PL through the first initialization transistor TR1. The drive transistor TR4 has a source terminal connected to the data signal line DL through the write control transistor TR3, and to the anode of the light-emission element X through the light-emission control transistor TR6. The drive transistor TR4 has a drain terminal connected to the gate terminal of the drive transistor TR4 through the threshold control transistor TR2, and to the high-voltage power source line PL through the power source supply transistor TR5. The anode of the light-emission element X is connected to a second initialization power source line IL through the second initialization transistor TR7. The second initialization power source line IL and a cathode 25 (a common electrode) of the light-emission element X are supplied with, for example, the same low-voltage power source (ELVSS).

First Embodiment

Figure 3:
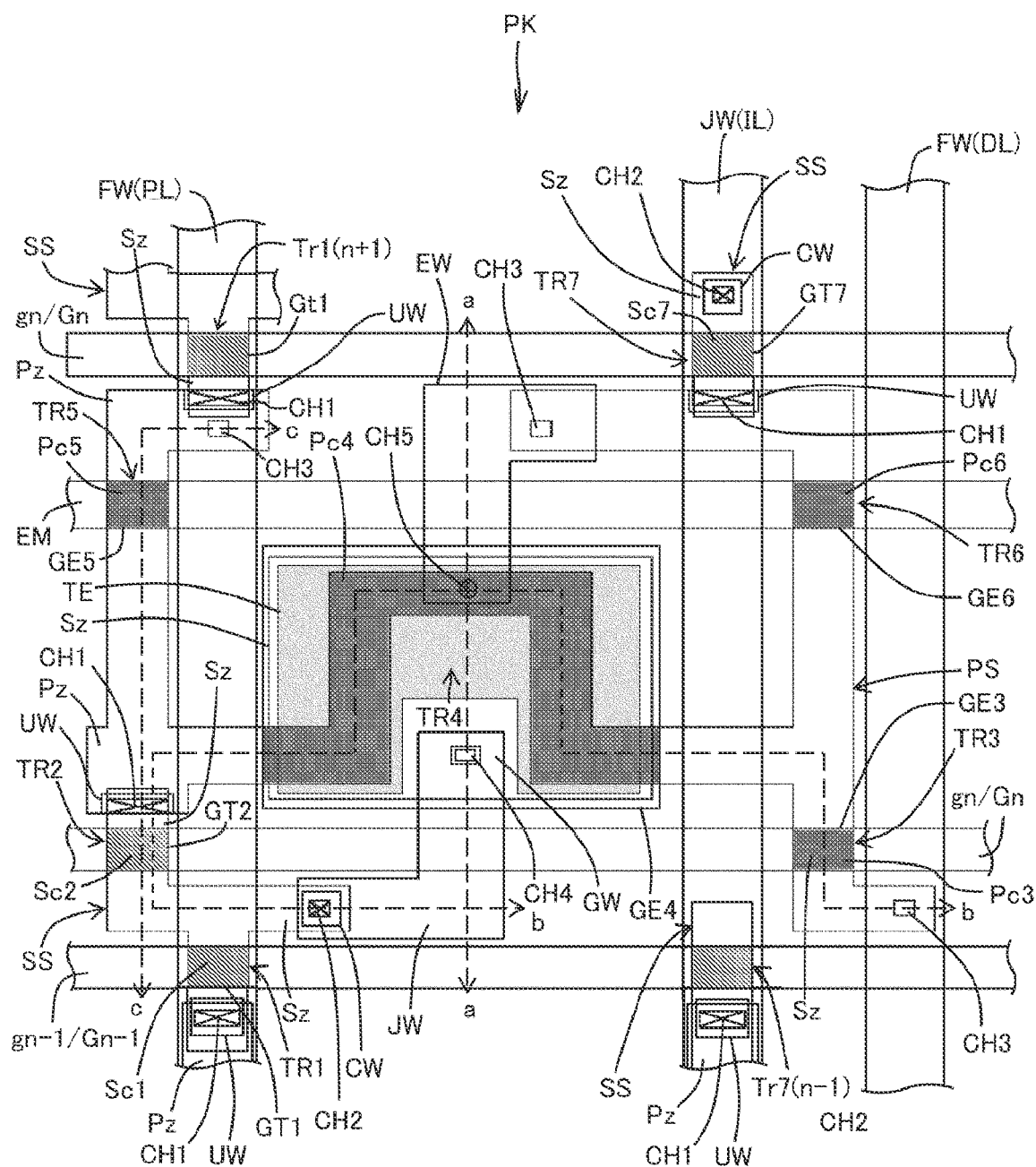
FIG. 3 is a plan view illustrating an exemplary configuration of a pixel circuit in the display device according to a first embodiment.
Figure 4:
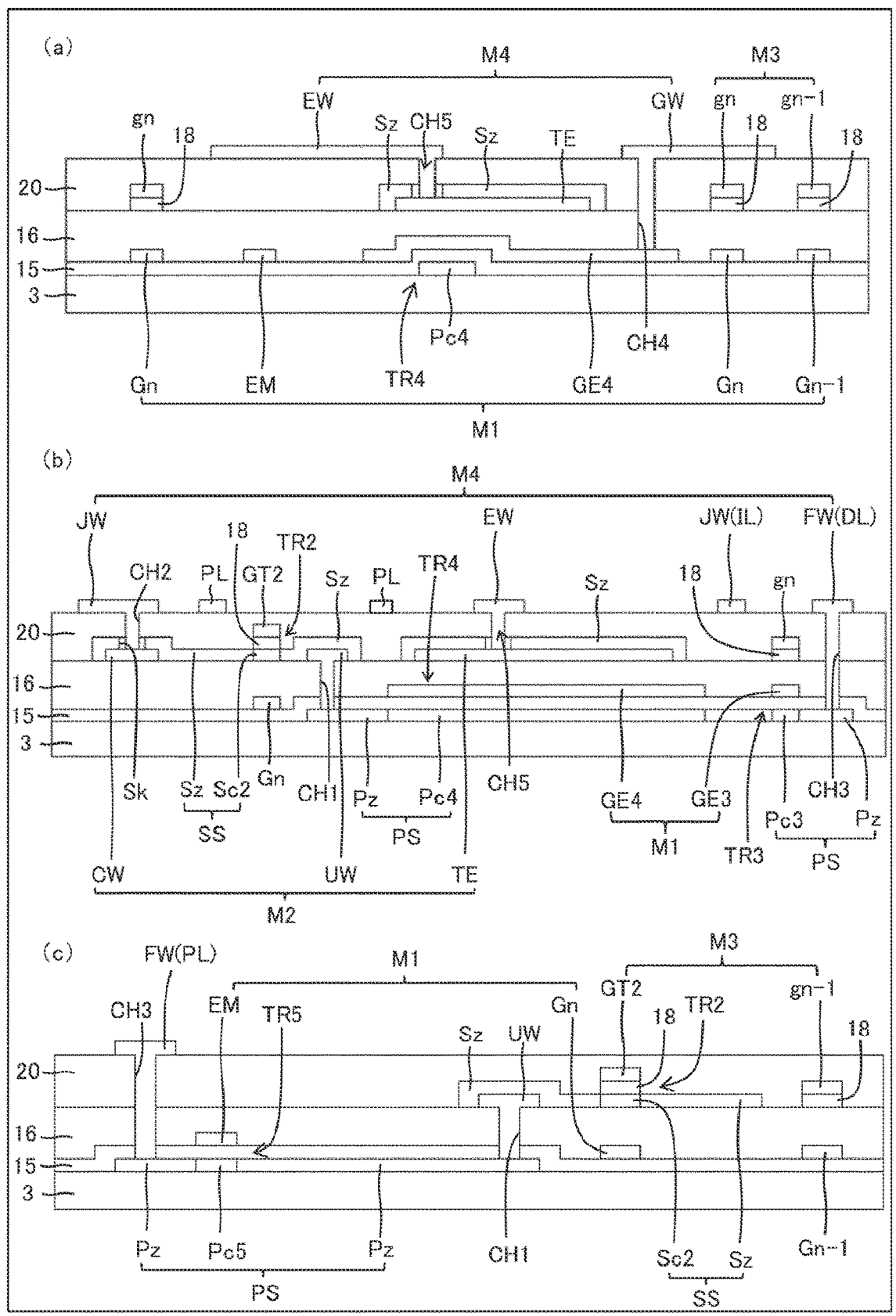
FIG. 4(a) is a cross-sectional view, taken along line a-a in FIG. 3.
FIG. 4(b) is a cross-sectional view, taken along line b-b in FIG. 3.
FIG. 4(c) is a cross-sectional view, taken along line c-c in FIG. 3.

FIG. 3 is a plan view illustrating an exemplary configuration of a pixel circuit in a display device according to a first embodiment. FIG. 4(a) is a cross-sectional view, taken along line a-a in FIG. 3. FIG. 4(b) is a cross-sectional view, taken along line b-b in FIG. 3. FIG. 4(c) is a cross-sectional view, taken along line c-c in FIG. 3. As illustrated in FIGS. 3 and 4, in the first embodiment, provided on the substrate 12 in the order are: the base coat film 3; the crystalline silicon semiconductor layer PS; the first gate insulating film 15; the first metal layer M1 including first gate electrodes GE3 to GE6; the first interlayer insulating film 16; the second metal layer M2 serving as a lower metal layer; the oxide semiconductor layer SS; the second gate insulating film 18; the third metal layer M3 including second gate electrodes GT1, GT2, and GT7; the second interlayer insulating film 20; and the fourth metal layer M4 serving as an upper metal layer.

The light-emission control line EM, the first gate electrode GE4, and the lower scan signal lines Gn−1 and Gn are included in the first metal layer M1. The contact wire CW, a counter electrode TE, and a lower wire UW are included in the second metal layer M2. Upper scan signal lines gn−1 and gn (Gn−1 and Gn in FIG. 2) are included in the third metal layer M3. The first gate electrode GE3 is a portion of the lower scan signal line Gn. The second gate electrode GT2 is a portion of the upper scan signal line gn. An electrode wire EW, an upper wire JW (including the second initialization power source line IL), a metal wire FW (including the high-voltage power source line PL and the data signal line DL), and a gate connection wire GW are included in the fourth metal layer (an upper metal layer) M4.

The pixel circuit PK includes a first transistor including the crystalline silicon semiconductor layer PS, and a second transistor including the oxide semiconductor layer SS. Provided as the first transistor are the write control transistor TR3, the drive transistor TR4, the power source supply transistor TR5, and the light-emission control transistor TR6. Provided as the second transistor are the first initialization transistor TR1, the threshold control transistor TR2, and the second initialization transistor TR7. These transistors are, for example, n-channel transistors. Since the transistors are n-channel transistors, a common scan signal is input to control terminals of, for example, the threshold control transistor TR2, the write control transistor TR3, and the second initialization transistor TR7 so that these transistors can be turned ON and OFF. Details of the operation will be described later. Note that the transistors shall not be limited to n-channel transistors. For example, a transistor containing the crystalline silicon semiconductor layer PS may also be a p-channel transistor. Moreover, application of the transistors shall not be limited to the pixel circuit illustrated in FIG. 2. The disclosure is applicable to a common pixel circuit.

The crystalline silicon semiconductor layer PS includes: first channel regions Pc3, Pc4, Pc5, and Pc6; and a first conductor region Pz (a source region and a drain region). The oxide semiconductor layer SS includes: second channel regions Sc1, Sc2, and Sc7; and a second conductor region Sz (a source region and a drain region).

The first initialization transistor TR1 includes: the second channel region Sc1; the second conductor region Sz including two second conductor regions Sz (the source region and the drain region) holding therebetween the second channel region Sc1; and the second gate electrode GT1 (a control terminal). The threshold control transistor TR2 includes: the second channel region Sc2; the second conductor region Sz including two second conductor regions Sz (the source region and the drain region) holding therebetween the second channel region Sc2; and the second gate electrode GT2 (a control terminal). The write control transistor TR3 includes: the first channel region Pc3; the first conductor region Pz including two first conductor regions Pz (the source region and the drain region) holding therebetween the first channel region Pc3; and the first gate electrode GE3 (a control terminal). The drive transistor TR4 includes: the first channel region Pc4; the first conductor region Pz including two first conductor regions Pz (the source region and the drain region) holding therebetween the first channel region Pc4; and the first gate electrode GE4 (a control terminal). The power source supply transistor TR5 includes: the first channel region Pc5; the first conductor region Pz including two first conductor regions Pz (the source region and the drain region) holding therebetween the first channel region Pc5; and the first gate electrode GE5 (a control terminal). The light-emission control transistor TR6 includes: the first channel region Pc6; the first conductor region Pz including two first conductor regions Pz (the source region and the drain region) holding therebetween the first channel region Pc6; and the first gate electrode GE6 (a control terminal). The second initialization transistor TR7 includes: the second channel region Sc7; the second conductor region Sz including two second conductor regions Sz (the source region and the drain region) holding therebetween the second channel region Sc7; and the second gate electrode GT7 (a control terminal).

The second conductor region Sz covers a top face and a side face of each of the contact wire CW, the counter electrode TE, and the lower wire UW included in the second metal layer (the lower metal layer) M2. The second gate insulating film 18 matches the third metal layer M3.

First Contact Hole

The first gate insulating film 15 and the first interlayer insulating film 16 are provided with a first contact hole CH1 exposing the first conductor region Pz and electrically connecting together the first conductor region Pz and the second conductor region Sz.

In the first contact hole CH1, the lower wire UW is in contact with the first conductor region Pz so that the first conductor region Pz and the second conductor region Sz electrically connect together through the lower wire UW. The lower wire UW is shaped into an island so that the top face and the side face of the lower wire UW are covered with the second conductor region Sz.

Second Contact Hole

The second interlayer insulating film 20 is provided with a second contact hole CH2 electrically connecting together the second conductor region Sz and a wire (e.g. the upper wire JW) in the fourth metal layer M4. The contact wire CW is shaped into an island so that the top face and the side face of the contact wire CW are covered with the second conductor region Sz. As illustrated in FIG. 3 and FIG. 4(b), the second conductor region Sz includes an opening Sk communicating with the second contact hole CH2 in the second interlayer insulating film 20. The opening Sk exposes the contact wire CW. In the opening Sk, the upper wire JW is in contact with the contact wire CW, and the second conductor region Sz and the upper wire JW electrically connect together through the contact wire CW. Note that, in the second contact hole CH2, the upper wire JW overlaps the contact wire CW.

As illustrated in FIG. 3 and FIG. 4(b), the second conductor region Sz covers the contact wire CW, and, in the opening of the second conductor region Sz, the second initialization wire IL is in contact with the contact wire CW. Hence, the second conductor region Sz and the second initialization wire IL electrically connect together.

Third Contact Hole

The first gate insulating film 15, the first interlayer insulating film 16, and the second interlayer insulating film 20 are provided with a third contact hole CH3 exposing the first conductor region Pz and electrically connecting together the first conductor region Pz and a wire (e.g. the metal wire FW and the electrode wire EW) in the fourth metal layer M4. As illustrated in FIG. 4(b) and FIG. 4(c), in the third contact hole CH3, the metal wire FW or the electrode wire EW is in contact with the first conductor region Pz.

Fourth Contact Hole

The first interlayer insulating film 16 and the second interlayer insulating film 20 are provided with a fourth contact hole CH4 electrically connecting together a wire (e.g. the first gate electrode GE4) in the first metal layer M1 and a wire (e.g. the gate connection wire GW) in the fourth metal layer M4. As illustrated in FIG. 4(a), the fourth contact hole CH4 exposes the first gate electrode GE4 so that the gate connection wire GW is in contact with the first gate electrode GE4.

Fifth Contact Hole

The second interlayer insulating film 20 is provided with a fifth contact hole CH5 electrically connecting together a wire (e.g. the counter electrode TE) in the second metal layer M2 and a wire (e.g. the electrode wire EW) in the fourth metal layer M4.

As illustrated in FIG. 4(a) and FIG. 4(b), the second conductor region Sz is provided to protect the counter electrode TE. Similar to the second contact hole CH2, the second conductor region Sz includes the opening Sk communicating with the fifth contact hole CH5. The opening Sk exposes the counter electrode TE so that the counter electrode TE and the electrode wire EW are in contact with each other.

Note that the counter electrode TE and the first gate electrode GE4, facing each other across the first interlayer insulating film 16, constitute the capacitor Cp.

As illustrated in FIG. 3, the second conductor region Sz located over the first contact hole CH1 and the second conductor region Sz located over the second contact hole CH2 are different conductor regions sandwiching either the same second channel region Sc2 (corresponding to the threshold control transistor TR2), or the same second channel region Sc1 (corresponding to the first initialization transistor TR1). That is, one of the second conductor regions Sz is the source region and the other one of the second conductor regions Sz is the drain region.

The first conductor region Pz located over the first contact hole CH1 and the first conductor region Pz located over the third contact hole CH3 are different conductor regions sandwiching the same first channel region Pc5 (corresponding to the power source supply transistor TR5). That is, one of the first conductor regions Pz is the source region and the other one of the first conductor regions Pz is the drain region.

In FIGS. 3 and 4, the first gate electrode GE3 corresponding to the write control transistor TR3 is a portion of the lower scan signal line Gn. The second gate electrode GT2 corresponding to the threshold control transistor TR2 is a portion of the upper scan signal line gn.

Each of the first gate electrodes GE5 corresponding to the power source supply transistor TR5 and the first gate electrode GE6 corresponding to the light-emission control transistor TR6 is a portion of the light-emission control line EM receiving a light-emission control signal in common between the first gate electrodes GE5 and GE6.

Each of the second gate electrode GT7 corresponding to the second initialization transistor TR7 of the pixel circuit PK in the current stage and a second gate electrode Gt1 corresponding to a first initialization transistor Tr1 (Tr1 (n+1) in FIG. 3) of the pixel circuit PK in a succeeding stage (n+1-th stage) is a portion of the upper scan signal line gn receiving a scan signal in common between the second gate electrodes GT7 and Gt1.

The first initialization power source line to connect to a conductive electrode of the first initialization transistor TR1 may be in common with the high-voltage power source line PL. The second initialization power source line IL to connect to a conductive electrode of the second initialization transistor TR7 receives the same voltage as the second electrode (a cathode) of the light-emission element X does.

Figure 5:
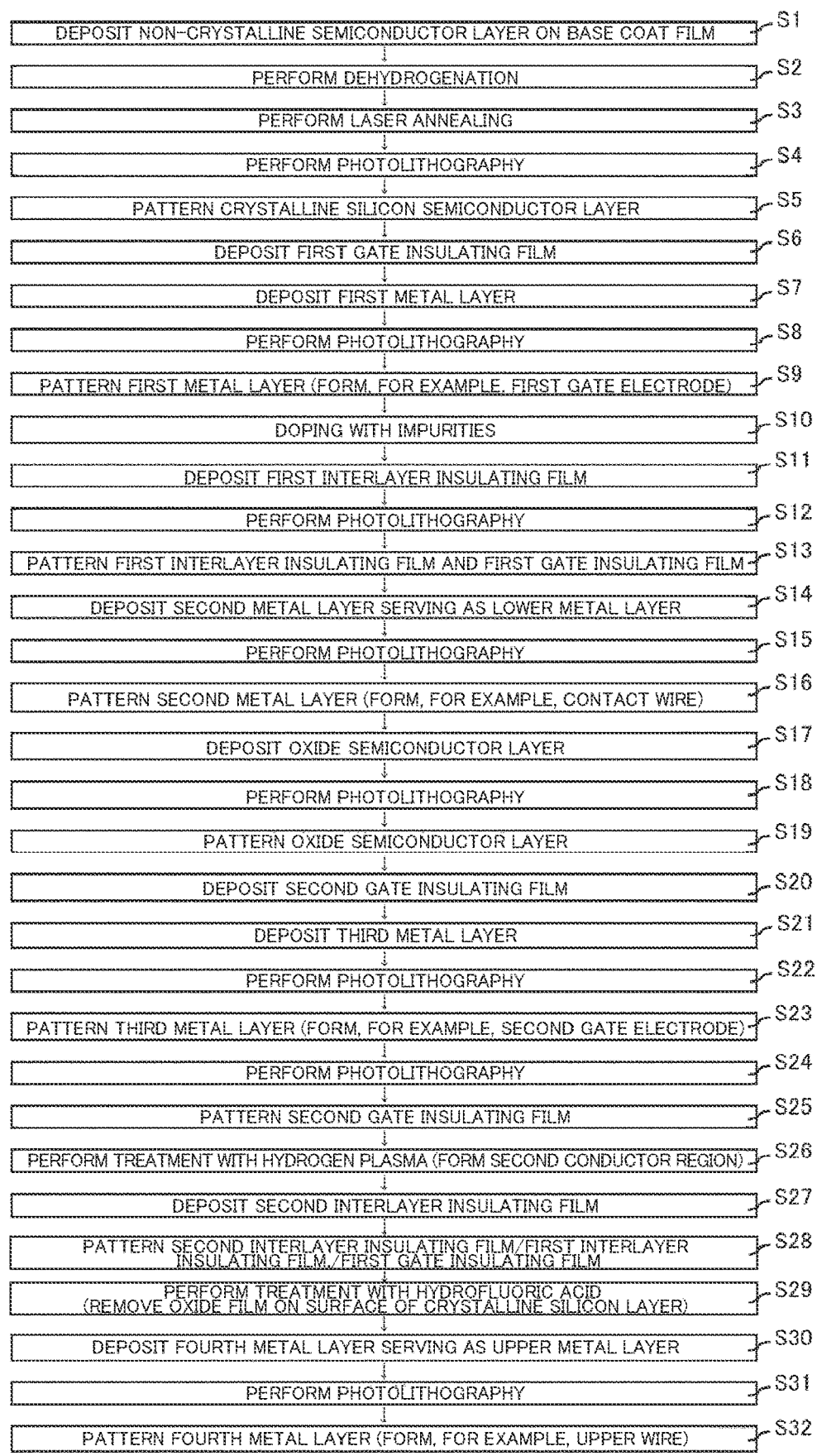
FIG. 5 is a flowchart showing how to produce the display device according to the first embodiment.

FIG. 5 is a flowchart showing how to produce the display device according to the first embodiment. At Step S1, the base coat film 3 is deposited on the substrate 12. After that, a non-crystalline semiconductor layer is deposited on the base coat film 3. At Step S2, dehydrogenation is performed. At Step S3, a crystalline silicon semiconductor film is formed by laser annealing. At Step S4, photolithography is performed. At Step S5, the crystalline silicon semiconductor film is patterned to form the crystalline silicon semiconductor layer PS. At Step S6, the first gate insulating film 15 is deposited. At Step S7, the first metal layer M1 is deposited. At Step S8, photolithography is performed. At Step S9, the first metal layer M1 is patterned to form, for example, the first gate electrodes GE3 to GE6 and the lower scan signal line Gn. At Step S10, the crystalline silicon semiconductor layer PS is doped with impurities. Here, doped to be conductive is a portion, of the crystalline silicon semiconductor layer PS, not facing the pattern (such as the first gate electrode) of the first metal layer M1 (forming first conductor region Pz).

At Step S11, the first interlayer insulating film 16 is deposited. At Step S12, photolithography is performed. At Step S13, the first interlayer insulating film 16 and the first gate insulating film 15 are patterned, and the first contact hole CH1 is formed. At Step S14, the second metal layer M2 serving as the lower metal layer is deposited. The second metal layer M2 is made of a metal material (e.g. molybdenum, tungsten, and titanium) free from erosion due to treatment with hydrofluoric acid to be described later. At Step S15, photolithography is performed. At Step S16, the second metal layer M2 is patterned to form the contact wire CW and the counter electrode TE.

At Step S17, the oxide semiconductor layer SS is deposited. At Step S18, photolithography is performed. At Step S19, the oxide semiconductor layer SS is patterned. At Step S20, the second gate insulating film 18 is deposited. At Step S21, the third metal layer M3 is deposited. At Step S22, photolithography is performed. At Step S23, the third metal layer M3 is patterned to form, for example, the second gate electrodes GT1, GT2, and GT7, and the upper scan signal line gn. At Step S24, photolithography is performed. At Step S25, the second gate insulating film 18 is patterned. Note that, at Steps S22 to S25, a resist mask for the third metal layer is used for etching of both the third metal layer M3 and the second gate insulating film 18. Hence, the photolithography step is required just once.

At Step S26, the oxide semiconductor layer SS is treated with hydrogen plasma. Here, reduced to be conductive is a portion, of the oxide semiconductor layer SS, not facing the pattern (such as the second gate electrode) of the third metal layer M3 (forming the second conductor region Sz). At Step S27, the second interlayer insulating film 20 is deposited. At Step S28, the second interlayer insulating film 20, the oxide semiconductor layer SS, the first interlayer insulating film 16, and the first gate insulating film 15 are patterned, and the contact holes CH2 to CH5 are formed.

At Step S29, treatment with hydrofluoric acid is performed (removing an oxide film on a surface of the crystalline silicon semiconductor layer PS). In this step, the oxide semiconductor layer SS (the second conductor region Sz) is eroded; however, the second metal layer M2 (including the CW and the TE) is not eroded. At Step S30, the fourth metal layer M4 serving as the upper metal layer is deposited. At Step S31, photolithography is performed. At Step S32, the fourth metal layer M4 is patterned to form, for example, the upper wire JW, the electrode wire EW, the metal wire FW, and the gate connection wire GW.

In the first embodiment, the contact wire CW in contact with the second conductor region Sz is provided to coincide with the second contact hole CH2. Such a feature makes it possible to form the contact holes CH2 and CH5 at a single step of Step S28. Compared with a case where the CH2 is formed at a separate step, the feature makes it possible to simplify the production steps.

Note that, if the contact wire CW is not provided when the contact holes CH2 to CH5 are formed at a single step, the second conductor region Sz is etched at Step S29 in the treatment with hydrofluoric acid. The etched second conductor region Sz could cause a rise in contact resistance and a failure in electrical connection in the contact hole CH2.

Note that the opening Sk of the second conductor region Sz communicates with the second contact hole CH2 in the treatment with hydrofluoric acid at Step S29, and, in plan view, the opening Sk is typically larger than the second contact hole CH2. However, the opening Sk could be smaller than the opening of the second contact hole CH2, depending on a time period for the treatment with hydrofluoric acid and a position of the opening Sk in the substrate. The same goes for the opening formed at Step S29 in the second conductor region Sz below the fifth contact hole CH5.

In the first embodiment, at the first contact hole CH1 that coincides with the first conductor region Pz and the second conductor region Sz, the first conductor region Pz and the second conductor region Sz connect together through the lower wire UW included in the second metal layer M2. Such a feature makes it possible to stabilize contact resistance, compared with a case where the first conductor region Pz and the second conductor region Sz are in direct contact with each other. Moreover, the feature makes it possible to reduce the area of the pixel circuit, compared with a case where different contact holes are arranged to individually coincide with the first conductor region Pz and the second conductor region Sz.

Figure 6:
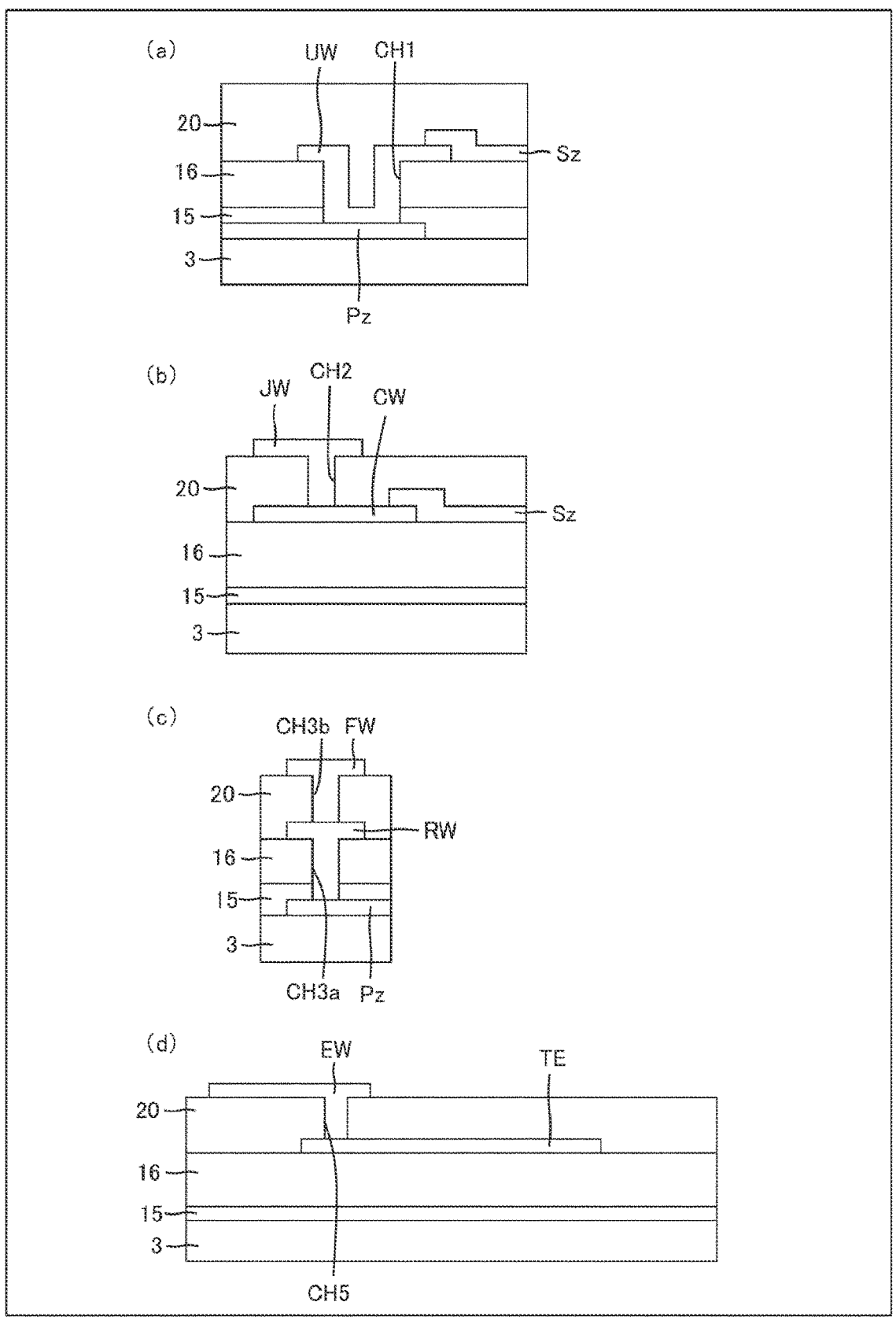
FIG. 6 is a cross-sectional view illustrating a modification of the first embodiment.

FIG. 6 is a cross-sectional view illustrating a modification of the first embodiment. Around the first contact hole CH1 in FIGS. 3 and 4, the second conductor region Sz overlaps, but not limited to, two edges, of the lower wire UW, facing each other across the first contact hole CH1. As illustrated in FIG. 6(a), the second conductor region Sz may be in contact with only one of the two edges, of the lower wire UW, facing each other across the first contact hole CH1, and the lower wire UW may line an interior wall and a bottom face of the first contact hole CH1 (so that the first contact hole CH1 is not filled with the lower wire UW).

Around the second contact hole CH2 in FIGS. 3 and 4, the second conductor region Sz overlaps, but not limited to, two edges, of the contact wire CW, facing each other across the second contact hole CH2. As illustrated in FIG. 6(b), the second conductor region Sz may be in contact with only one of the two edges, of the contact wire CW, facing each other across the second contact hole CH2.

Around the third contact hole CH3 in FIGS. 3 and 4, as illustrated in FIG. 6(c), the second metal layer M2 (the lower metal layer) may be provided with a relay wire RW. Hence, the first conductor region Pz and the relay wire RW may electrically connect together through a contact hole CH3a penetrating the first gate insulating film 15 and the first interlayer insulating film 16, and the relay wire RW and the metal wire FW may electrically connect together through a contact hole CH3b penetrating the second interlayer insulating film 20.

Around the fifth contact hole CH5 in FIGS. 3 and 4, the counter electrode TE is covered with the second conductor region Sz. However, the counter electrode TE may be provided in any given manner. As illustrated in FIG. 6(d), the counter electrode TE, which connects to the electrode wire EW through the fifth contact hole CH5, does not have to be covered with the second conductor region Sz.

Second Embodiment

Figure 7:
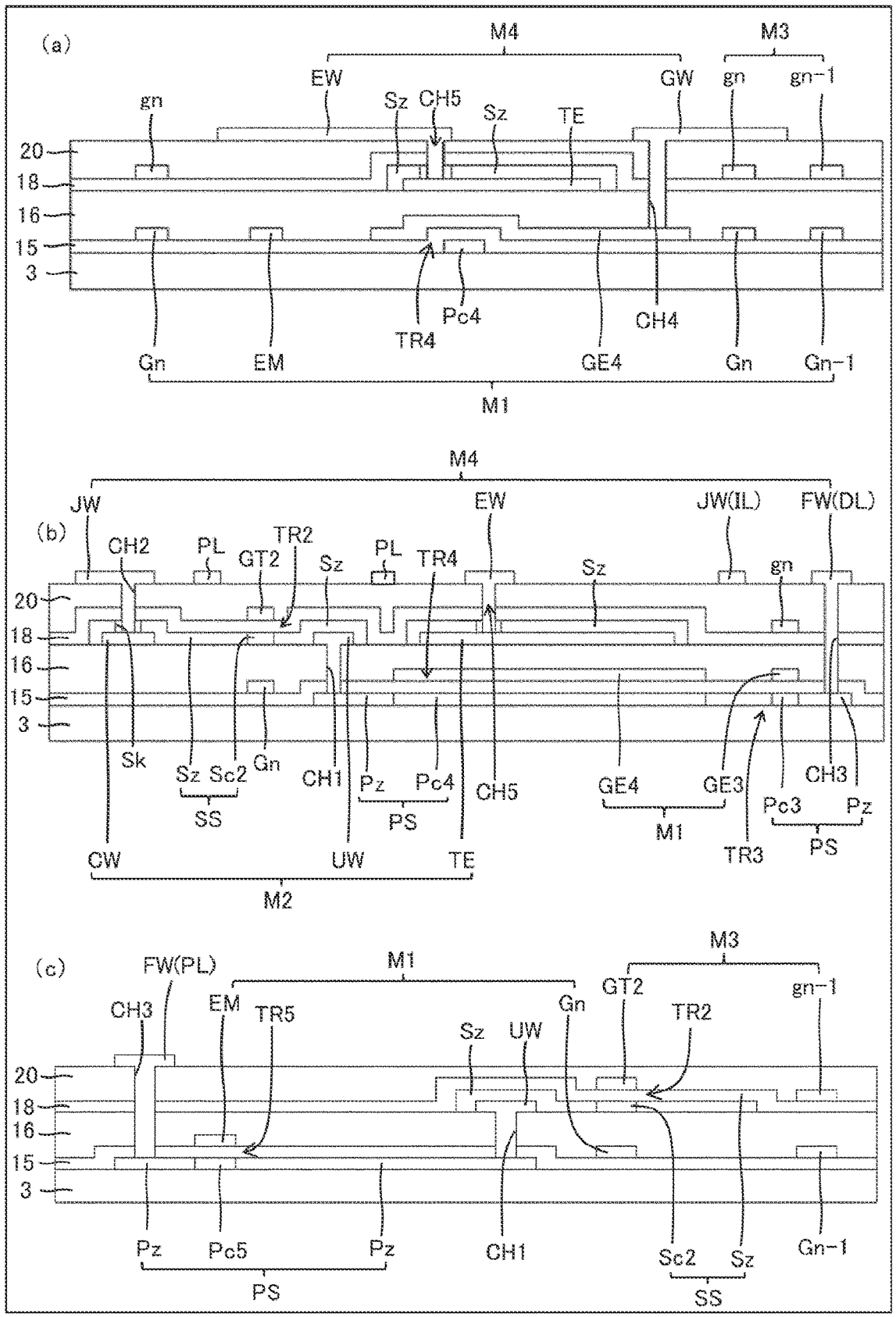
FIG. 7 is a cross-sectional view illustrating a configuration of a second embodiment.
Figure 8:
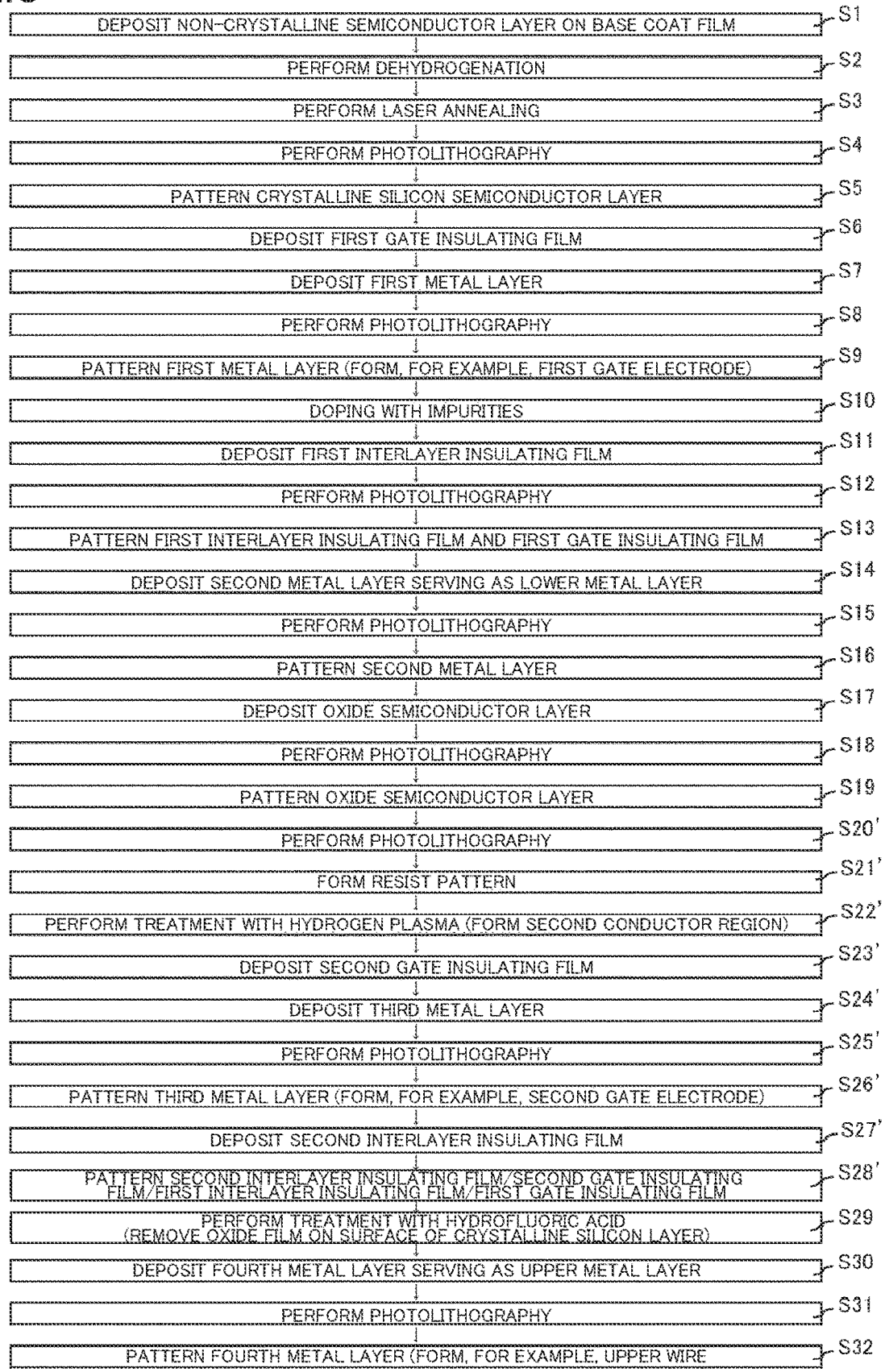
FIG. 8 is a flowchart showing how to produce the display device according to the second embodiment.

FIG. 7 is a cross-sectional view illustrating a configuration of a second embodiment. FIG. 8 is a flowchart showing how to produce the display device according to the second embodiment. In the first embodiment (FIGS. 3 and 4), the pattern of the second gate insulating film 18 matches the pattern of the third metal layer M3. However, the second gate insulating film 18 may be provided in any given manner. As illustrated in FIG. 7, the second gate insulating film 18 may be monolithically formed (except regions corresponding to the contact holes CH2 to CH5). Alternatively, the second gate insulating film 18 may cover the second conductor region Sz.

At Step S20' in FIG. 8, following Steps S1 to S19 in FIG. 5, photolithography is performed. At Step S21', a resist pattern is formed. At Step S22', treatment with hydrogen plasma is performed (forming second conductor region) At Step S23', the second gate insulating film 18 is deposited. At Step S24', the third metal layer M3 is deposited. At Step S25', photolithography is performed. At Step S26', the third metal layer M3 is patterned (forming, for example, the second gate electrode). At Step S27', the second interlayer insulating film 20 is deposited. At Step S28', the second interlayer insulating film 20, the second gate insulating film 18, the first interlayer insulating film 16, and the first gate insulating film 15 are patterned. Steps S29 to S32 are the same as those in FIG. 5. The second embodiment 2 is advantageous in eliminating the need of Step S25 in FIG. 5.

Third Embodiment

Figure 9:
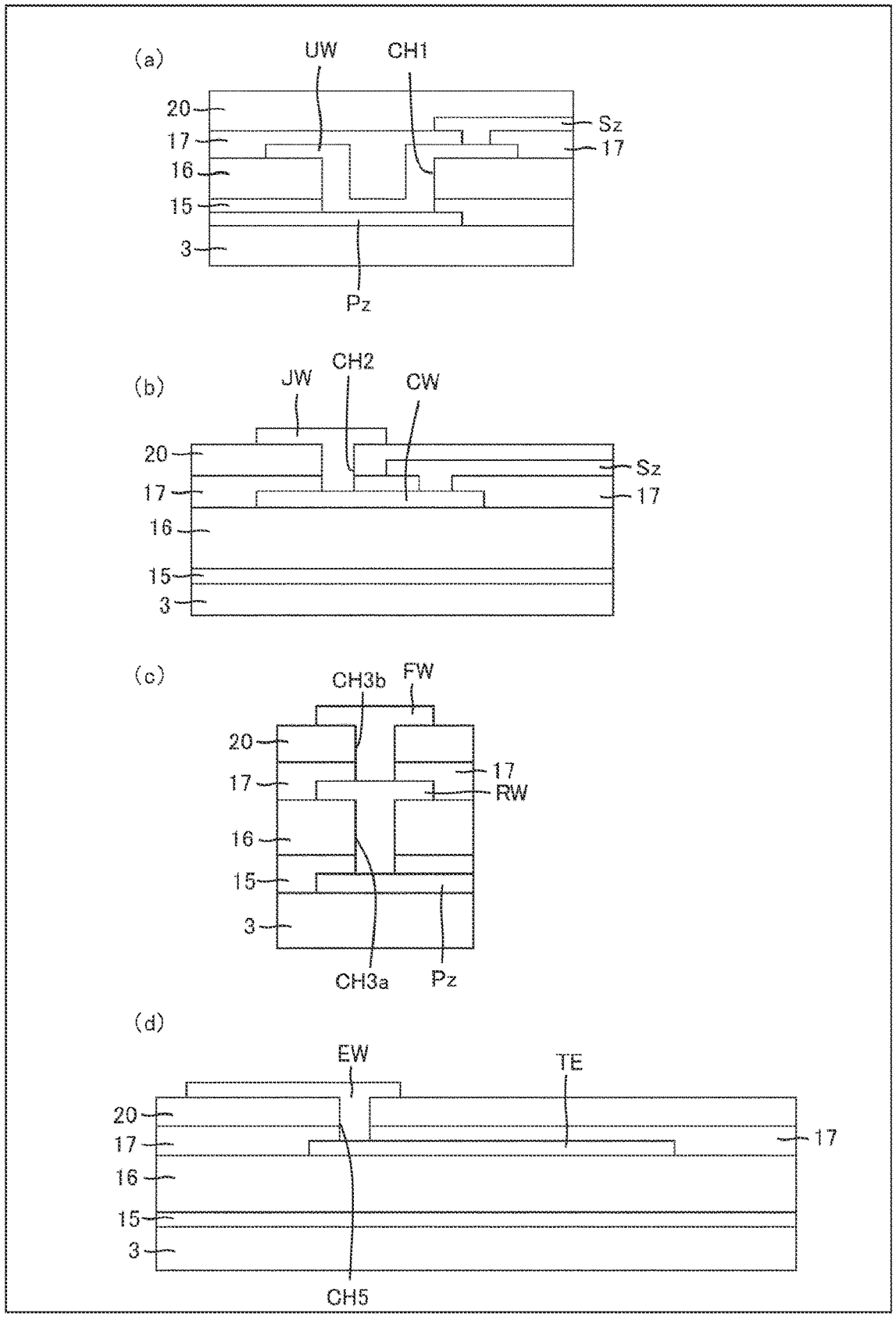
FIG. 9 is a cross-sectional view illustrating a configuration of a third embodiment.

FIG. 9 is a cross-sectional view illustrating a configuration of a third embodiment. FIG. 9(a) corresponds to a cross-sectional view, taken along line a-a in FIG. 3. FIG. 9(b) corresponds to a cross-sectional view, taken along line b-b in FIG. 3. FIG. 9(c) corresponds to a cross-sectional view, taken along line c-c in FIG. 3. In the third embodiment, a third interlayer insulating film 17 is provided above the second metal layer (including the lower wire UW, the contact wire CW, and the counter electrode TE) and below the oxide semiconductor layer SS (including the second conductor region Sz).

In FIG. 9(a), the third interlayer insulating film 17 includes an opening in which the second conductor region Sz and the lower wire UW are in contact with each other. In the first contact hole CH1 penetrating the first gate insulating film 15 and the first interlayer insulating film 16, the lower wire UW is in contact with the first conductor region Pz, and the first conductor region Pz and the second conductor region Sz electrically connect together through the lower wire UW. The second conductor region Sz is formed to overlap only one of two edges, of the lower wire UW, facing each other across the first contact hole CH1. (The second conductor region Sz does not overlap the other edge.) The lower wire UW is formed to line an interior wall and a bottom face of the first contact hole CH1 (so that the first contact hole CH1 is not filled with the lower wire UW).

In FIG. 9(b), the second interlayer insulating film 20 and the third interlayer insulating film 17 are provided with the second contact hole CH2 to expose the contact wire CW. In the second contact hole CH2, the upper wire JW is in contact with the contact wire CW, and the second conductor region Sz and the upper wire JW electrically connect together through the contact wire CW. Note that the second conductor region Sz overlaps only one of two edges, of the contact wire CW, facing each other across the second contact hole CH2. (The second conductor region Sz does not overlap the other edge.)

In FIG. 9(c), the second metal layer M2 (the lower metal layer) is provided with the relay wire RW. Hence, the first conductor region Pz and the relay wire RW electrically connect together through the contact hole CH3a penetrating the first gate insulating film 15 and the first interlayer insulating film 16, and the relay wire RW and the metal wire FW electrically connect together through the contact hole CH3b penetrating the second interlayer insulating film 20.

In FIG. 9(b), the second interlayer insulating film 20 and the third interlayer insulating film 17 are provided with the fifth contact hole CH5 to expose the counter electrode TE. In the fifth contact hole CH5, the electrode wire EW and the counter electrode TE are in contact with, and electrically connected to, each other.

The above embodiments are intended for exemplification and description, and not for limitation, of the disclosure. It is apparent for those skilled in the art that many modifications are available in accordance with the exemplification and description.

First Aspect

A display device includes: a crystalline silicon semiconductor layer, a first gate insulating film, a first gate electrode, a first interlayer insulating film, a lower metal layer, an oxide semiconductor layer, a second gate insulating film, a second gate electrode, a second interlayer insulating film, and an upper metal layer, all of which are provided above a substrate in a stated order; and a first transistor including the crystalline silicon semiconductor layer, and a second transistor including the oxide semiconductor layer.

The crystalline silicon semiconductor layer includes a first channel region and a first conductor region.

The oxide semiconductor layer includes a second channel region and a second conductor region.

The first gate insulating film and the first interlayer insulating film are provided with a first contact hole exposing the first conductor region and electrically connecting together the first conductor region and the second conductor region.

The lower metal layer includes a contact wire in contact with the second conductor region.

The upper metal layer includes an upper wire.

The second interlayer insulating film is provided with a second contact hole in which the upper wire overlaps the contact wire.

The second conductor region and the upper wire electrically connect together through the contact wire.

Second Aspect

In the display device according to, for example, the first aspect, the second conductor region is provided with an opening communicating with the second contact hole.

In the opening of the second conductor region, the upper wire and the contact wire are in contact with each other.

Third Aspect

In the display device according to, for example, the second aspect, the opening of the second conductor region in plan view is larger than the second contact hole.

Fourth Aspect

In the display device according to, for example, any one of the first to third aspects, the oxide semiconductor layer covers a top face and a side face of the lower metal layer.

Fifth Aspect

In the display device according to, for example, any one of the first to fourth aspects, the second conductor region covers a top face and a side face of the lower metal layer.

Sixth Aspect

In the display device according to, for example, any one of the first to fifth aspects, the second gate insulating film is provided to match the second gate electrode.

Seventh Aspect

In the display device according to, for example, any one of the first to sixth aspects, the second gate insulating film is provided to cover the second conductor region.

Eighth Aspect

In the display device according to, for example, any one of the first to seventh aspects, the lower metal layer includes a lower wire.

In the first contact hole, the lower wire is in contact with the first conductor region.

The first conductor region and the second conductor region electrically connect together through the lower wire.

Ninth Aspect

In the display device according to, for example, the eighth aspect, the lower wire is shaped into an island so that a top face and a side face of the lower wire are covered with the second conductor region.

Tenth Aspect

In the display device according to, for example, any one of the first to ninth aspects, the upper metal layer includes a metal wire.

The first gate insulating film, the first interlayer insulating film, and the second interlayer insulating film are provided with a third contact hole exposing the first conductor region and electrically connecting together the first conductor region and the metal wire.

In the third contact hole, the metal wire is in contact with the first conductor region.

Eleventh Aspect

In the display device according to, for example, any one of the first to tenth aspects, the upper metal layer includes a gate metal wire.

The first interlayer insulating film and the second interlayer insulating film are provided with a fourth contact hole exposing the first gate electrode and electrically connecting together the first gate electrode and the gate connection wire.

In the fourth contact hole, the gate connection wire is in contact with the first gate electrode.

Twelfth Aspect

In the display device according to, for example, any one of the first to eleventh aspects, the lower metal layer includes a counter electrode.

The upper metal layer includes an electrode wire.

The second conductor region and the second interlayer insulating film are provided with a fifth contact hole exposing the counter electrode and electrically connecting together the counter electrode and the electrode wire.

In the fifth contact hole, the counter electrode and the electrode wire are in contact with each other.

Thirteenth Aspect

In the display device according to, for example, any one of the first to twelfth aspects, the first conductor region located over the first contact hole and the second conductor region located over the second contact hole are different conductor regions sandwiching the same second channel region.

Fourteenth Aspect

In the display device according to, for example, the tenth aspect, the first conductor region located over the first contact hole and the first conductor region located over the third contact hole are different conductor regions sandwiching the same first channel region.

Fifteenth Aspect

The display device according to, for example, any one of the first to fourteenth aspects, further includes a light-emission element; and a pixel circuit configured to control the light-emission element. The light-emission element and the pixel circuit correspond to a sub-pixel.

The pixel circuit includes: a drive transistor controlling a current of the light-emission element; a first initialization transistor connected between a first initialization power source line and a control terminal of the drive transistor; a threshold control transistor connected between a drain region and the control terminal of the drive transistor; a write control transistor connected between a source region of the drive transistor and a data signal line; a power source supply transistor connected between the drain region of the drive transistor and a high-voltage power source line; a light-emission control transistor connected between the source region of the drive transistor and a first electrode of the light-emission element; a second initialization transistor connected between the first electrode of the light-emission element and a second initialization power source line; and a capacitor connected to the control terminal of the drive transistor and configured to hold a data signal.

Sixteenth Aspect

In the display device according to, for example, the fifteenth aspect, the drive transistor is the first transistor.

Seventeen Aspect

In the display device according to, for example, any one of the first to eleventh aspects, the lower metal layer includes a counter electrode.

The first gate electrode and the counter electrode that overlaps the first gate electrode across the first interlayer insulating film constitute a capacitor.

Eighteenth Aspect

In the display device according to, for example, the fifteenth aspect, at least one of the first initialization transistor, the threshold control transistor, and the second initialization transistor is the second transistor.

Nineteenth Aspect

In the display device according to, for example, the fifteenth aspect, the threshold control transistor is the second transistor.

The write control transistor is the first transistor.

The first gate electrode corresponding to the write control transistor is a portion of a lower scan signal line, and the second gate electrode corresponding to the threshold control transistor is a portion of an upper scan signal line.

The lower scan signal line and the upper scan signal line receive a scan signal in common between the lower scan signal line and the upper scan signal line.

Twentieth Aspect

In the display device according to, for example, the fifteenth aspect, each of the power source supply transistor and the light-emission control transistor is the first transistor.

Each of the first gate electrode corresponding to the power source supply transistor and the first gate electrode corresponding to the light-emission control transistor is a portion of a light-emission control line receiving a light-emission control signal in common between the first gate electrode corresponding to the power source supply and the first gate electrode corresponding to the light-emission control transistor.

Twenty First Aspect

In the display device according to, for example, the fifteenth aspect, each of the second initialization transistor of the pixel electrode in a current stage and the first initialization transistor of the pixel circuit in a succeeding stage is the second transistor.

Each of the second gate electrode corresponding to the second initialization transistor of the pixel circuit in the current stage and the second gate electrode corresponding to the first initialization transistor of the pixel circuit in the succeeding stage is a portion of a scan signal line receiving a scan signal in common between the second gate electrode corresponding to the second initialization transistor of the pixel circuit in the current stage and the second gate electrode corresponding to the first initialization transistor of the pixel circuit in the succeeding stage.

Twenty Second Aspect

In the display device according to, for example, any one of the fifteenth to twenty first aspects, the first initialization power source line and the high-voltage power source line are a common wire.

Twenty Third Aspect

In the display device according to any one of the fifteenth to twenty second aspects, the second initialization power source line receives the same voltage as a second electrode of the light-emitting element does.

Twenty Fourth Aspect

The display device according to any one of the first to twenty third aspects further includes a third interlayer insulating film provided between the lower metal layer and the oxide semiconductor layer.

The invention claimed is:

1. A display device, comprising:
   a crystalline silicon semiconductor layer, a first gate insulating film, a first gate electrode, a first interlayer insulating film, a lower metal layer, an oxide semiconductor layer, a second gate insulating film, a second gate electrode, a second interlayer insulating film, and an upper metal layer, all of which are provided above a substrate in a stated order; and
   a first transistor including the crystalline silicon semiconductor layer, and a second transistor including the oxide semiconductor layer, wherein the crystalline silicon semiconductor layer includes a first channel region and a first conductor region, the oxide semiconductor layer includes a second channel region and a second conductor region, the first gate insulating film and the first interlayer insulating film are provided with a first contact hole exposing the first conductor region and electrically connecting the first conductor region to the second conductor region, the lower metal layer includes a contact wire in contact with the second conductor region, the upper metal layer includes an upper wire, the second interlayer insulating film is provided with a second contact hole in which the upper wire overlaps the contact wire, and the second conductor region and the upper wire are electrically connected to each other through the contact wire.

2. The display device according to claim 1, wherein
the second conductor region is provided with an opening communicating with the second contact hole, and
in the opening of the second conductor region, the upper wire and the contact wire are in contact with each other.

3. The display device according to claim 2, wherein
in a plan view, the opening of the second conductor region is larger than the second contact hole.

4. The display device according to claim 1, wherein
the oxide semiconductor layer covers a top face and a side face of the lower metal layer.

5. The display device according to claim 1, wherein
the second conductor region covers a top face and a side face of the lower metal layer.

6. The display device according to claim 1, wherein
the second gate insulating film is provided to match the second gate electrode.

7. The display device according to claim 1, wherein
the second gate insulating film is provided to cover the second conductor region.

8. The display device according to claim 1, wherein
the lower metal layer further includes a lower wire,
in the first contact hole, the lower wire is in contact with the first conductor region, and
the first conductor region and the second conductor region are electrically connected to each other through the lower wire.

9. The display device according to claim 8, wherein
the lower wire is shaped into an island so that a top face and a side face of the lower wire are covered with the second conductor region.

10. The display device according to claim 1, wherein
the upper metal layer further includes a metal wire,
the first gate insulating film, the first interlayer insulating film, and the second interlayer insulating film are provided with a third contact hole exposing the first conductor region and electrically connecting the first conductor region to the metal wire, and
in the third contact hole, the metal wire is in contact with the first conductor region.

11. The display device according to claim 1, wherein
the upper metal layer further includes a gate connection wire,
the first interlayer insulating film and the second interlayer insulating film are provided with a fourth contact hole exposing the first gate electrode and electrically connecting the first gate electrode to the gate connection wire, and
in the fourth contact hole, the gate connection wire is in contact with the first gate electrode.

12. The display device according to claim 1, wherein
the lower metal layer further includes a counter electrode,
the upper metal layer further includes an electrode wire,
the second conductor region and the second interlayer insulating film are provided with a fifth contact hole exposing the counter electrode and electrically connecting the counter electrode to the electrode wire, and
in the fifth contact hole, the counter electrode and the electrode wire are in contact with each other.

13. The display device according to claim 1, wherein
the second conductor region located over the first contact hole and the second conductor region located over the second contact hole are different conductor regions sandwiching a same second channel region.

14. The display device according to claim 10, wherein
the first conductor region located over the first contact hole and the first conductor region located over the third contact hole are different conductor regions sandwiching a same first channel region.

15. The display device according to claim 1, wherein
the lower metal layer further includes a counter electrode, and
the first gate electrode and the counter electrode that overlaps the first gate electrode across the first interlayer insulating film form a capacitor.

16. The display device according to claim 1, further comprising:
a light-emission element; and
a pixel circuit configured to control the light-emission element, the light-emission element and the pixel circuit corresponding to a sub-pixel, wherein
the pixel circuit includes:
a drive transistor configured to control a current of the light-emission element;
a first initialization transistor connected between a first initialization power source line and a control terminal of the drive transistor;
a threshold control transistor connected between a drain region of the drive transistor and the control terminal of the drive transistor;
a write control transistor connected between a source region of the drive transistor and a data signal line;
a power source supply transistor connected between the drain region of the drive transistor and a high-voltage power source line;
a light-emission control transistor connected between the source region of the drive transistor and a first electrode of the light-emission element;
a second initialization transistor connected between the first electrode of the light-emission element and a second initialization power source line; and
a capacitor connected to the control terminal of the drive transistor and configured to hold a data signal.

17. The display device according to claim 16, wherein
the drive transistor is the first transistor.

18. The display device according to claim 16, wherein
at least one of the first initialization transistor, the threshold control transistor, and the second initialization transistor is the second transistor.

19. The display device according to claim 16, wherein
the threshold control transistor is the second transistor,
the write control transistor is the first transistor,
the first gate electrode corresponding to the write control transistor is a portion of a lower scan signal line, and the second gate electrode corresponding to the threshold control transistor is a portion of an upper scan signal line, and the lower scan signal line and the upper scan signal line receive a scan signal in common between the lower scan signal line and the upper scan signal line.

20. The display device according to claim 16, wherein each of the power source supply transistor and the light-emission control transistor is the first transistor, and each of the first gate electrode corresponding to the power source supply transistor and the first gate electrode corresponding to the light-emission control transistor is a portion of a light-emission control line receiving a light-emission control signal in common between the first gate electrode corresponding to the power source supply and the first gate electrode corresponding to the light-emission control transistor.

* * * * *